US005751645A

United States Patent [19]
Tsukikawa

[11] Patent Number: 5,751,645
[45] Date of Patent: May 12, 1998

[54] SEMICONDUCTOR MEMORY DEVICE WITH REDUCED OUTPUT NOISE

[75] Inventor: Yasuhiko Tsukikawa, Hyogo, Japan

[73] Assignee: Mitsubishi Denki Kabushiki Kaisha, Tokyo, Japan

[21] Appl. No.: 781,795

[22] Filed: Jan. 10, 1997

[30] Foreign Application Priority Data

May 14, 1996 [JP] Japan ................... 8-119022

[51] Int. Cl.$^6$ ................................................ G11C 7/00
[52] U.S. Cl. ................................ 365/194; 365/233.5
[58] Field of Search ........................ 365/195, 189.05, 365/233.5

[56] References Cited

U.S. PATENT DOCUMENTS

| | | | |
|---|---|---|---|
| 5,331,593 | 7/1994 | Merritt et al. | 365/189.05 |
| 5,331,601 | 7/1994 | Parris | 365/189.05 |
| 5,404,335 | 4/1995 | Tobita | 365/194 |
| 5,488,581 | 1/1996 | Nagao et al. | 365/189.05 |
| 5,532,961 | 7/1996 | Mori et al. | 365/189.05 |
| 5,594,704 | 1/1997 | Konishi et al. | 365/195 |

FOREIGN PATENT DOCUMENTS 7-182864  7/1995  Japan.

Primary Examiner—Joseph A. Popek
Assistant Examiner—Michael T. Tran
Attorney, Agent, or Firm—Lowe, Price, LeBlanc & Becker

[57] ABSTRACT

An inhibition signal CAIHT for inhibiting, in adaptation to the data output timing of an output buffer, an internal column address strobe signal int/CAS output from a CAS buffer from falling from an H level to an L level for a prescribed period is generated and then applied to the CAS buffer. During data output, the internal column address strobe signal int/CAS is inhibited from being brought into an active state for the prescribed period, so that new data can be prevented from being transferred to the output buffer during this inhibition period, whereby erroneous data resulting from output noise can be prevented from being output. Consequently, a semiconductor memory device capable of correctly outputting data without the influence of the output noise is provided.

8 Claims, 11 Drawing Sheets

$D1 < D3 < D1+D2$

FIG.5A
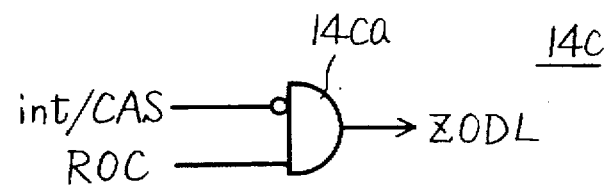
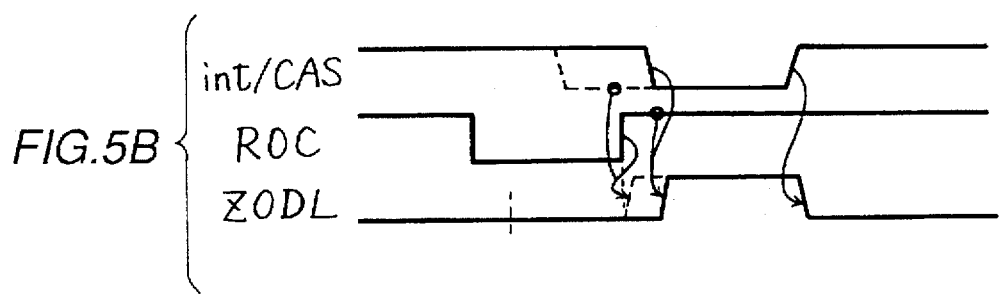
FIG.5B

FIG. 7B { WHEN CAIHT= "L" /CAS int/CAS

FIG. 7C { WHEN CAIHT= "H" /CAS int/CAS

FIG.9
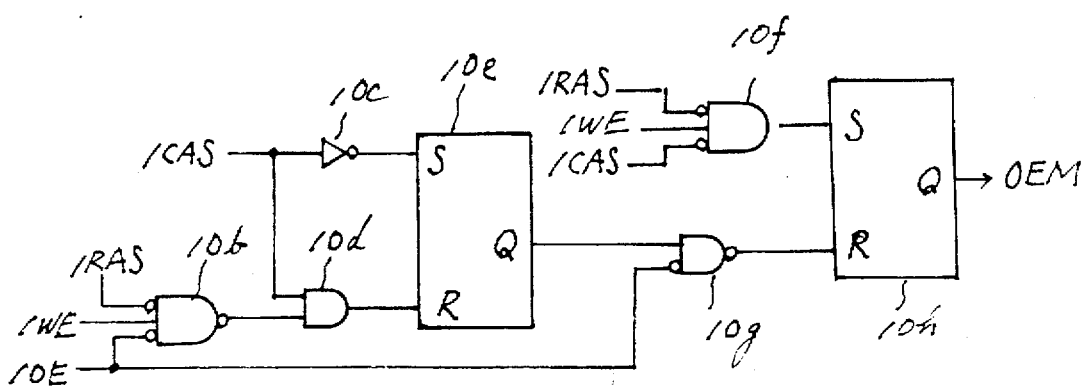
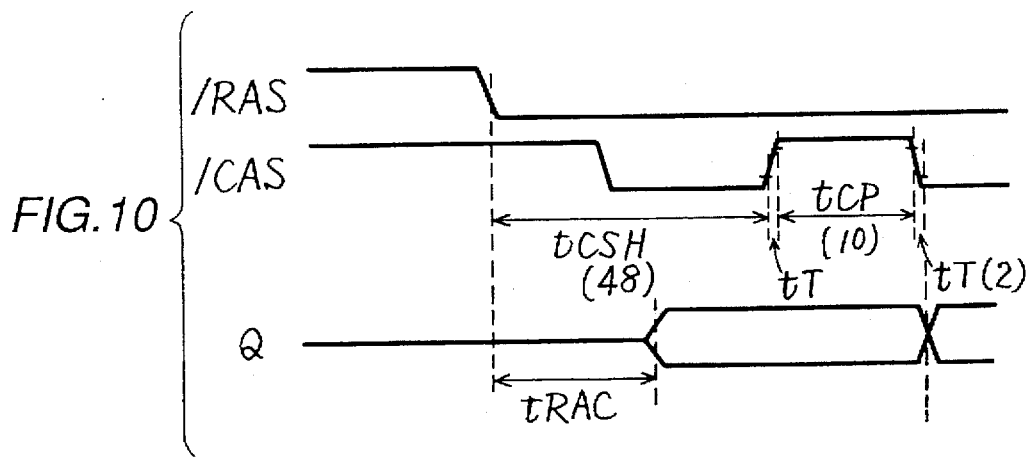
FIG.10
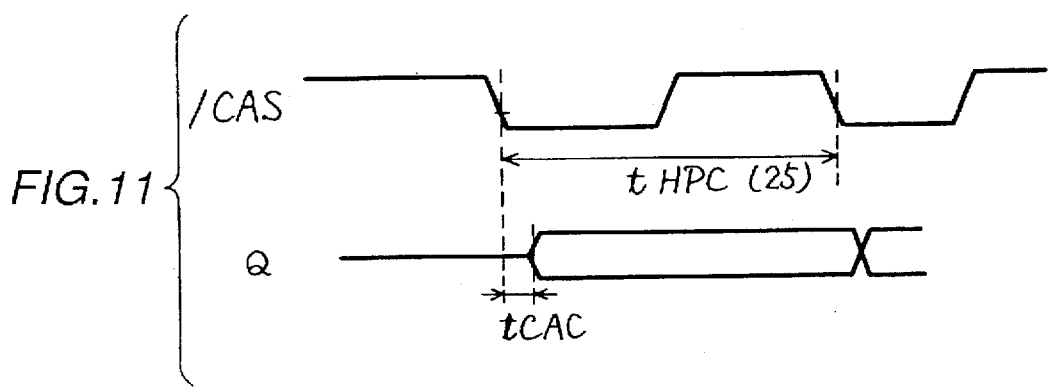
FIG.11

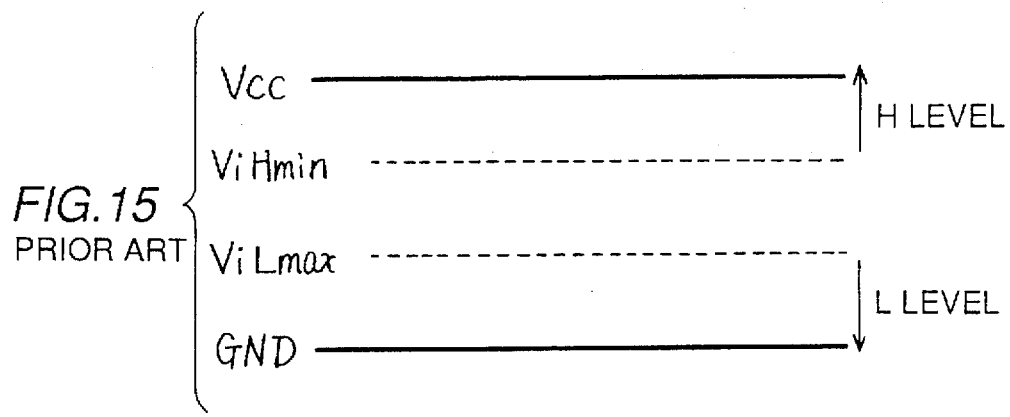
FIG.15 PRIOR ART
FIG.16A PRIOR ART
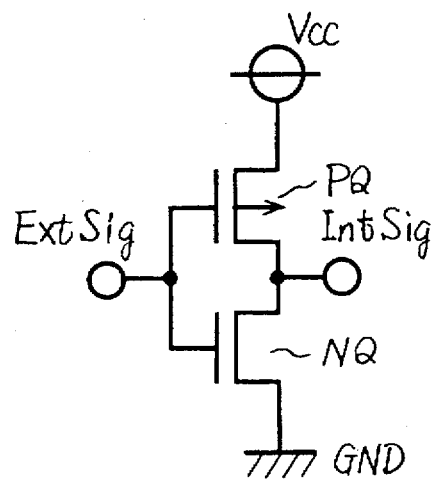
FIG.16B PRIOR ART
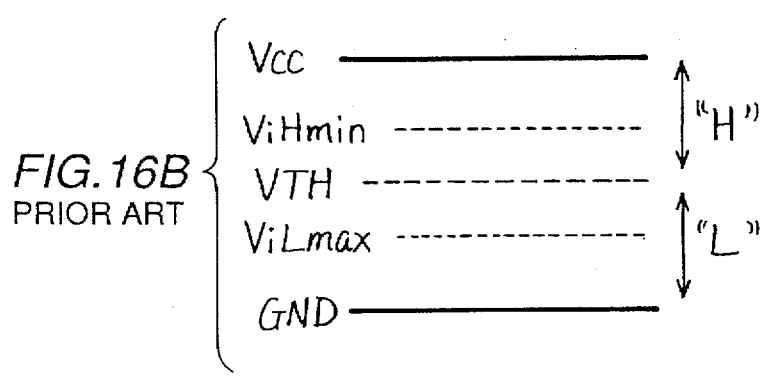

SEMICONDUCTOR MEMORY DEVICE WITH REDUCED OUTPUT NOISE

BACKGROUND OF THE INVENTION

1. Field of the Invention

The present invention relates to a semiconductor memory device, and more particularly, to a dynamic type semiconductor memory device operating in an EDO (Extended Data Output) mode.

2. Description of the Background Art

Storage capacity of semiconductor memory devices is increasing year after year, and there are various word configurations. A word configuration indicates the number of bits of data. In the case of the 16M bit DRAM (Dynamic Random Access Memory), for example, there are provided various numbers of bits of data (the number of bits of 1 word) to be input/output at a time, such as 16M words×1 bit, 4M words×4 bits, 2M words×8 bits and 1M words×16 bits. When the number of bits of data to be output at a time is large, much more output buffer circuits operate simultaneously as compared with the case where the number of bits of 1 word is small, and therefore, the amount of current flowing in these output buffer circuits increases, whereby operating power supply voltage and ground potential in a semiconductor memory device (chip) are more likely to change with time due to the current consumption in these output buffer circuits. The phenomenon that power supply potential or ground potential changes due to current consumption during operation of an output buffer circuit is hereinafter referred to as "output noise". The output noise adversely affects the stable operation of the semiconductor memory device, as will be described below.

FIG. 15 shows the relationship between a potential level and a logic level with respect to an external input signal. In FIG. 15, power supply voltage Vcc and ground potential GND are externally applied to a semiconductor integrated circuit device (semiconductor memory device). An external signal applied to the semiconductor integrated circuit device is at an H level or an L level. A signal potential at an H level is defined as a potential higher than a constant potential ViHmin. A potential at an L level is defined as a potential lower than another constant potential ViLmax.

These constant potentials ViHmin and ViLmax are determined relatively to the ground potential GND so that the following relationship is satisfied.

GND<ViLmax<ViHmin<Vcc

On the other hand, in the semiconductor integrated circuit device, an input buffer receiving an external signal for buffering the received external signal to generate an internal signal is provided, as shown in FIG. 16A. In FIG. 16A, a CMOS inverter constituted by a p channel MOS transistor PQ and an n channel MOS transistor NQ is shown as the input buffer. This input buffer receives an external signal ExtSig for buffering and inverting the received signal to produce an internal signal IntSig.

The input buffer (CMOS inverter) has a logic threshold voltage VTH which serves as a reference for decision on whether a signal is at H level or L level, as shown in FIG. 16B. When the external signal ExtSig is at a potential level higher than the logic threshold voltage VTH, the input buffer (CMOS inverter) determines that the external signal ExtSig is at an H level. On the other hand, when the external signal ExtSig is at a potential level lower than the logic threshold voltage VTH, the input buffer (CMOS inverter) determines that the external signal ExtSig is at an L level. The potentials ViHmin and ViLmax are determined by an external specification. Therefore, if a potential level of the logic threshold voltage VTH is set between the constant potentials ViHmin and ViLmax, the semiconductor integrated circuit device satisfies the external standard, and can precisely determine a logic level of the external signal ExtSig and produce an internal signal IntSig according to the result of the decision.

FIG. 17A schematically shows a structure of a signal input/output portion of the semiconductor integrated circuit device. In FIG. 17A, the semiconductor integrated circuit device includes an output buffer 900 for outputting a signal (data) and an input buffer 902 for buffering an external signal ExtSig to produce an internal signal. Both output buffer 900 and input buffer 902 operate with power supply voltage Vcc' on an internal power supply line 903 and ground potential GND' on an internal ground line 905 as operating power supply potentials. Internal power supply line 903 is connected to a power supply node Vcc, and internal ground line 905 is connected to a ground node GND. There exist stray inductance (L) 904a and parasitic resistance (R) 906a between internal power supply line 903 and power supply node Vcc, and stray inductance (L) 904b and parasitic resistance (R) 906b between internal ground line 905 and ground node GND. The operation of the semiconductor integrated circuit device shown in FIG. 17A at the time of outputting a signal will now be described with reference to a waveform chart of the operation shown in FIG. 17B.

When an output signal Q from output buffer 900 rises from an L level to an H level, output buffer 900 supplies current from power supply node Vcc to an output node through internal power supply line 903, parasitic resistance 906a and stray inductance 904a. Therefore, in this case, power supply current Icc flows through stray inductance 904a and parasitic resistance 906a, and a potential level of voltage Vcc' on internal power supply line 903 is reduced by impedance of parasitic resistance 906a and stray inductance 904a.

Furthermore, when the output signal Q from output buffer 900 falls from an H level to an L level, output buffer 900 discharges current to ground node GND through internal ground line 905, stray inductance 904b and parasitic resistance 906b. A potential level of ground potential GND' on internal ground line 905 is increased by this ground current IGND.

Voltage Vcc' on internal power supply line 903 and ground potential GND' on internal ground line 905 are also applied to input buffer 902. Therefore, the input logic threshold voltage VTH of input buffer 902 is changed by variation in the voltages Vcc' and GND'. Normally, the input logic threshold voltage VTH is determined by the values of power supply voltage Vcc' and ground potential GND' (normally one-half of Vcc'–GND'). Accordingly, as shown in FIG. 17B, when power supply current Icc flows and a potential level of operating power supply voltage Vcc' is reduced, a level of the input logic threshold voltage VTH of input buffer 902 is also reduced. When this logic threshold voltage VTH becomes lower than the potential ViLmax of the external standard as shown at (i) of FIG. 17B, input buffer 902 regards an L level of the external signal ExtSig as an H level and therefore cannot determine the level correctly.

Furthermore, when ground current IGND flows and ground potential GND' increases, the logic threshold voltage VTH of input buffer 902 increases ((ii) of FIG. 17B). In this case, when the logic threshold voltage VTH becomes higher than the potential ViHmin of the external standard, input buffer 902 regards an H level of the external signal ExtSig as an L level and therefore cannot determine the signal level correctly.

In other words, when output buffer 900 operates and output noise is generated, the logic threshold voltage VTH of input buffer 902 varies and input buffer 902 cannot determine a logic level of the external signal ExtSig correctly and therefore cannot produce an internal signal according to the logic level of the external signal ExtSig, resulting in malfunction of the semiconductor integrated circuit device. Problems specific to DRAMs which are caused by the output noise will now be described.

FIG. 18 is a timing chart illustrating the operation of an EDO (Extended Data Output) mode of DRAM. The data output operation thereof in the EDO mode will now be described with reference to FIG. 18.

A memory cycle is started when a row address strobe signal /RAS as a memory cycle start instruction signal falls from an H level to an L level. An external address is introduced as a row address (address X) in response to the fall of the row address strobe signal /RAS, and the memory cell row selection operation is started internally. Then, a column address strobe signal /CAS is driven from an H level to an L level. A column address (address Y) is introduced in synchronization with the fall of the column address strobe signal /CAS, and selection of a corresponding memory cell is performed. In addition, output of data from the output buffer is controlled with the column address strobe signal /CAS. In other words, new output data is made ready to be output in response to the fall of the column address strobe signal /CAS. More specifically, in FIG. 18, data Q1 in a memory cell corresponding to a column address Y1 is output in response to the fall of the column address strobe signal /CAS. Even if the column address strobe signal /CAS rises, the output data Q1 will be output continuously. Even if an address Y2 is applied during that period, data in a memory cell corresponding to the address Y2 will not be output.

When the column address strobe signal /CAS then falls to an L level, data Q3 in a memory cell corresponding to an address Y3 will be output.

In other words, in the EDO mode, data is continuously output externally until the column address strobe signal /CAS falls to an L level. Consequently, the data output period can be lengthened as compared with that of a structure in which output data is reset in response to the rise of the column address strobe signal /CAS as done during normal reading, and therefore, data can be output for a sufficient time period even with cycle time of the column address strobe signal /CAS being reduced, whereby high speed operation can be achieved (since CAS cycle time is reduced). Output data is reset in response to the rise of each of the column address strobe signal /CAS and the row address strobe signal /RAS to an H level.

FIG. 19 is a timing chart illustrating the data output operation at the time when output noise is generated in the EDO mode. In FIG. 19, data Q1 in a memory cell corresponding to an address Y1 is output in response to the fall of the column address strobe signal /CAS. When the ground potential is raised by ground current resulting from the output of data Q1, a logic threshold voltage of a buffer for producing an internal column address strobe signal int/CAS from the column address strobe signal /CAS increases, and the external column address strobe signal /CAS retained at an H level is regarded as an L level, whereby the internal column address strobe signal int/CAS falls to an L level. In the semiconductor memory device, the internal reading operation is carried out according to the internal column address strobe signal int/CAS. Accordingly, data Q2 in a memory cell which is designated by an address Y2 being applied at that time is output instead of data Q1 in response to the fall of the internal address strobe signal int/CAS. The data Q2 is data which should not be output. Accordingly, the semiconductor memory device outputs erroneous data due to the influence of the output noise, resulting in malfunction thereof.

SUMMARY OF THE INVENTION

It is an object of the present invention to provide a semiconductor memory device capable of correctly outputting data without being affected by output noise.

It is another object of the present invention to provide a semiconductor memory device with an EDO mode capable of preventing malfunction responsive to activation of an internal column address strobe by the influence of output noise.

Briefly, in a semiconductor memory device according to the present invention, activation of an internal column address strobe signal (internal read operation start instruction signal) is inhibited for a prescribed period from data output timing.

Transition from an inactive state to an active state of the internal read operation start instruction signal is inhibited in adaption to data output timing of data output circuitry, and therefore, transition from an inactive state to an active state of the internal read operation start instruction signal is inhibited even if output noise is generated during data output from the data output means. Accordingly, even if output noise is generated, the internal read operation start instruction signal will not be brought into an active stage, and therefore, new data is inhibited being introduced into and output from the data output circuitry, preventing erroneous data from being output therefrom.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a diagram showing a structure of a data transfer control circuit shown in FIG. 2A, and FIG. 5B is a signal waveform chart illustrating the operation of the data transfer control circuit shown in FIG. 5A.

FIG. 9 is a schematic diagram showing a structure of an output permission signal generation portion included in a control signal generation circuit shown in FIG. 1.

FIG. 10 is a diagram illustrating the relationship between RAS access time and a pulse width of a CAS active inhibition signal.

FIG. 11 is a diagram illustrating the relationship between CAS access time and a pulse width of a CAS active inhibition signal.

FIG. 15 is a diagram illustrating the relationship between a voltage level and a logic level of an input signal in a conventional semiconductor integrated circuit device.

FIG. 16A is a diagram showing a structure of a conventional input buffer, and FIG. 16B is a diagram illustrating the relationship between a logic threshold voltage of the input buffer shown in FIG. 16A and a potential level of an input signal.

DESCRIPTION OF THE PREFERRED EMBODIMENTS

[First Embodiment]

Figure 1A:
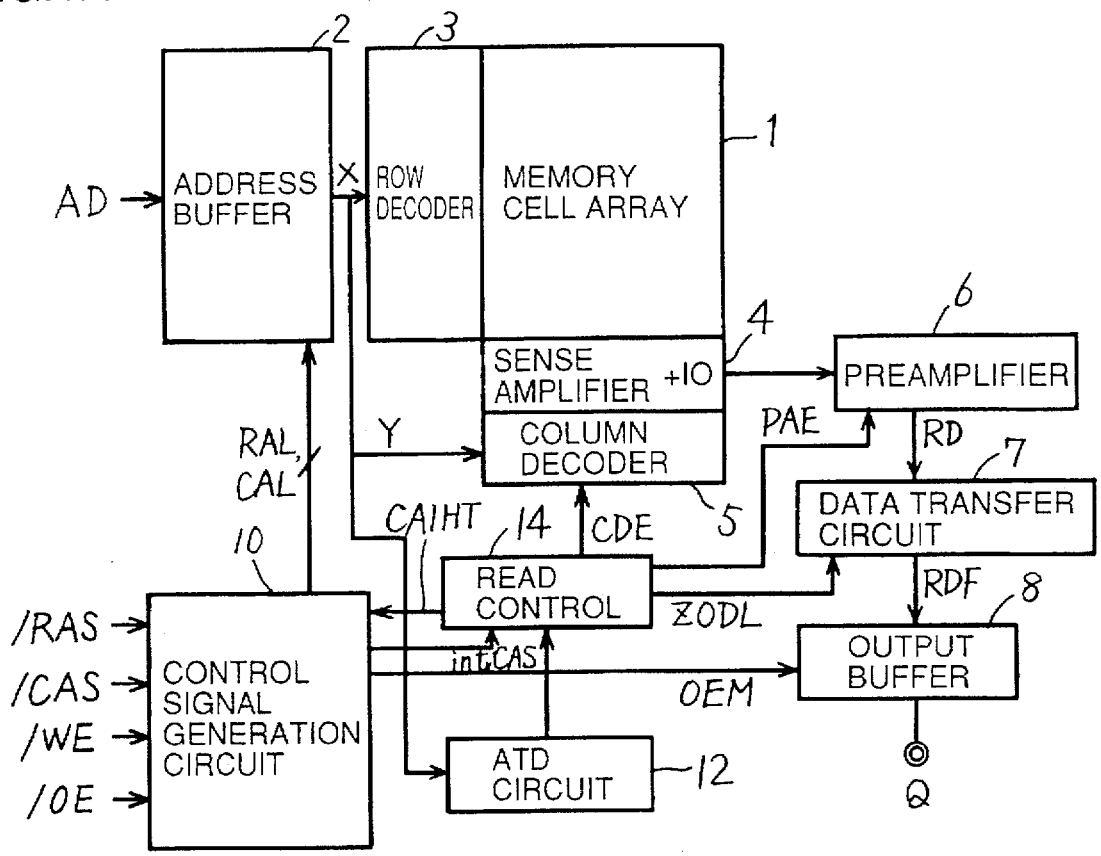
FIG. 1A is a schematic diagram showing the whole structure of a semiconductor memory device according to the present invention.

FIG. 1A schematically shows the whole structure of a semiconductor memory device according to a first embodiment of the present invention. FIG. 1A shows a structure of only a data read portion and does not show a structure of a data write portion. In FIG. 1A, the semiconductor memory device includes a memory cell array 1 having a plurality of memory cells arranged in a matrix of rows and columns, an address buffer 2 for introducing an external address signal AD to produce an internal row address X and an internal column address Y, a row decoder 3 for decoding an internal row address signal applied from address buffer 2 to select a corresponding row of memory cell array 1, a sense amplifier for sensing, amplifying and latching data in memory cells connected to the selected row of memory cell array 1, a column decoder 5 for decoding an internal column address Y applied from address buffer 2 to generate a signal for selecting a corresponding column of memory cell array 1, and an IO gate provided for each column of memory cell array 1 for connecting the selected column to an internal data line in accordance with a column selection signal from column decoder 5. In FIG. 1A, the sense amplifier and the IO gate are shown in one block 4.

The semiconductor memory device further includes a preamplifier 6 being activated in response to a preamplifier enable signal PAE for amplifying memory cell data read from block 4, a data transfer circuit 7 for transferring internal read data RD amplified by preamplifier 6 in accordance with a transfer control signal ZODL, and an output buffer 8 being activated in response to an output permission signal OEM for buffering data RDF transferred from data transfer circuit 7 to externally output the buffered data as read data Q.

The semiconductor memory device further includes, as a control signal generating portion, a control signal generation circuit 10 externally receiving a row address strobe signal /RAS, a column address strobe signal /CAS, a write enable signal /WE and an output enable signal /OE for generating internal control signals, that is, a row address latch instruction signal RAL, a column address latch instruction signal CAL, an output permission signal OEM for activating output buffer 8 and the like, an ATD circuit 12 for detecting transition in a column address signal applied from address buffer 2, and a read control circuit 14 for producing a column decoder enable signal CDE, a preamplifier enable signal PAE and a data transfer instruction signal ZODL in accordance with an address transition detection signal ATD from ATD circuit 12 and an internal column address strobe signal int/CAS. Read control circuit 14 produces a data read operation completion signal in accordance with the preamplifier enable signal PAE and also produces a CAS activation inhibition signal CAIHT for inhibiting transition of the internal column address strobe signal int/CAS to an active state.

Control signal generation circuit 10 determines timing of activation of row decoder 3 and the sense amplifier through a path which is not shown in accordance with the row address strobe signal /RAS.

Figure 1B:
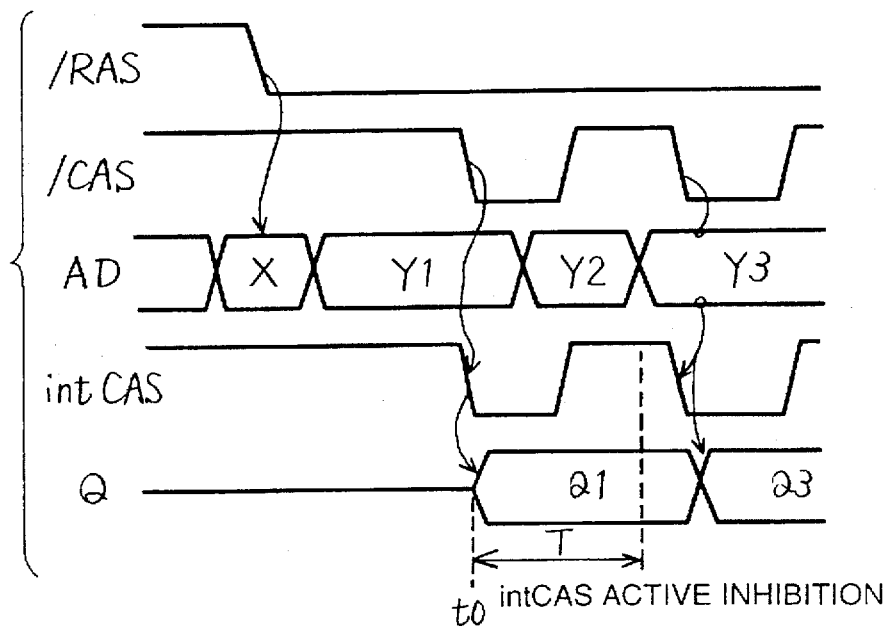
FIG. 1B is a signal waveform chart schematically illustrating the data output operation of the semiconductor memory device according to the present invention.

In the semiconductor memory device shown in FIG. 1A, the timing of data output is determined by the column address strobe signal /CAS, and the timing of start of the column selection operation by the address transition detection signal ATD. Therefore, the column address strobe signal CAS is herein used as an internal read operation start instruction signal. Referring now to FIG. 1B, the operation of the semiconductor memory device according to the present invention will be described.

When the row address strobe signal /RAS is brought into an active state at an L level, a memory cycle is started, and a row address latch instruction signal RAL from control signal generation circuit 10 is brought into an active state, and then, address buffer 2 introduces an external address signal AD to produce an internal row address signal X. Then, row decoder 3 is activated under the control of control signal generation circuit 10 to decode the address signal X and selects a corresponding row of memory cell array 1. Thereafter, the sense amplifier included in block 4 is activated by a control signal from control signal generation circuit 10 to sense, amplify and latch data in memory cells connected to the selected row of memory cell array 1.

When the column address strobe signal /CAS is at an H level, a column address buffer included in address buffer 2 is in a through state and applies a received address signal to ATD circuit 12. ATD circuit 12 produces an address transition detection signal ATD which is a one-shot pulse signal in response to transition in a column address signal Y. Read control circuit 14 activates column decoder 5 in response to the address transition detection signal ATD, and column decoder 5 decodes the column address signal Y applied from address buffer 2, generates a signal for selecting a column of memory cell array 1 and connects the selected column to preamplifier 6 through the IO gate included in block 4.

Read control circuit 14 brings a preamplifier enable signal PAE into an active state at prescribed timing in accordance with the address transition detection signal ATD. Preamplifier 6 is activated in response to the preamplifier activation signal PAE, and amplifies and latches memory cell data transmitted from the IO gate included in block 4 to produce internal read data RD. When preamplifier 6 is activated, the read data RD is brought into a definite state and an internal column address strobe signal int/CAS from control signal generation circuit 10 is brought into an active state at an L level, read control circuit 14 activates a data transfer instruction signal ZODL. Thus, data transfer circuit 7 introduces and latches internal read data RD from preamplifier 6 and then applies the data to output buffer 8.

Output buffer 8 has been brought into an active state in response to an output permission signal OEM applied from control signal generation circuit 10, and buffers data RDF transferred from data transfer circuit 7 to externally output the data as read data Q. Therefore, when data read operation in preamplifier 6 is completed and the internal column address strobe signal int/CAS is brought into an active state at an L level, the data transfer instruction signal ZODL is brought into an active state.

Data transfer circuit 7, of which structure will be described later in detail, is set into a latched state while the internal column address strobe signal int/CAS is being at an H level, and continuously outputs data RDF retained therein regardless of internal read data RD of preamplifier 6.

As shown in FIG. 1B, data Q1 selected in accordance with a column address Y1 is output in response to the fall of the column address strobe signal /CAS. If the external column address strobe signal /CAS rises to an H level and a column address applied from address buffer 2 changes into an address Y2 at that time, ATD circuit 12 produces an address transition detection signal ATD. In the present invention, activation of the internal column address strobe signal int/CAS is inhibited for a prescribed time period T after data Q1 is output. Thus, even if the internal column address strobe signal int/CAS is once bought into an inactive state at an H level, it is inhibited from going into an active state from an inactive state for the time period T, and therefore, it is inhibited that the signal ZODL goes into an active state in response to activation of the internal column address strobe signal int/CAS by the influence of output noise, and data according to the address Y2 is prevented from being output through data transfer circuit 7.

Then, when the external column address strobe signal /CAS again falls to an L level, the internal column address strobe signal int/CAS is brought into an active state at an L level and the data transfer instruction signal ZODL is brought into an active state, whereby data Q3 in accordance with an address Y3 is output through data transfer circuit 7 and output buffer 8.

As described above, the internal column address strobe signal int/CAS is inhibited from being brought into an active state from an inactive state for the prescribed time period T in adaptation to data output timing of output buffer 8. Thus, even if output noise is generated, the internal column address strobe signal int/CAS can be prevented from being erroneously driven to an L level, so that erroneous data can be prevented from being output in response to activation of the internal column address strobe signal by the influence of the output noise.

Figure 2A:
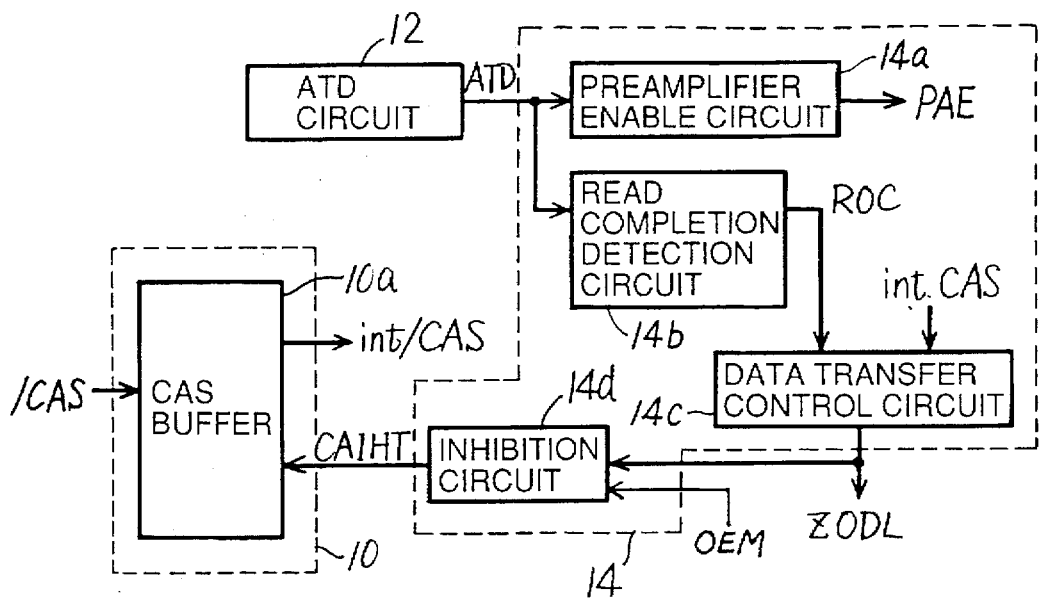
FIG. 2A is a schematic diagram showing a structure of a read control circuit shown in FIG. 1A.

FIG. 2A is a schematic block diagram showing a structure of read control circuit 14 and control signal generation circuit 10 shown in FIG. 1A. In FIG. 2A, read control circuit 14 includes a preamplifier enable circuit 14a responsive to a column address transition detection signal ATD from ATD circuit 12 for outputting a preamplifier enable signal PAE, a read completion detection circuit 14b responsive to the column address transition detection signal ATD for outputting a read operation completion instruction signal ROC, a data transfer control circuit 14c responsive to internal column address strobe signal int/CAS and the read operation completion instruction signal ROC from read completion detection circuit 14b for outputting a data transfer instruction signal ZODL, and an inhibition circuit 14d responsive to activation of output permission signal OEM and the data transfer instruction signal ZODL for outputting CAS active inhibition signal CAIHT to CAS buffer 10a.

CAS buffer 10a included in control signal generation circuit 10 receives an external column address strobe signal /CAS and buffers it to output the internal column address strobe signal int/CAS. In CAS buffer 10a, of which internal structure will be described later in detail, a path for driving the internal column address strobe signal int/CAS from an inactive state to an active state is cut off when the inhibition signal CAIHT from inhibition circuit 14d is in an active state. The internal column address strobe signal int/CAS is inhibited from being brought into an active state from an inactive state, whereby the data output operation in response to the fall (transition to an active state) of the internal column address strobe signal int/CAS is inhibited.

Figure 2B:
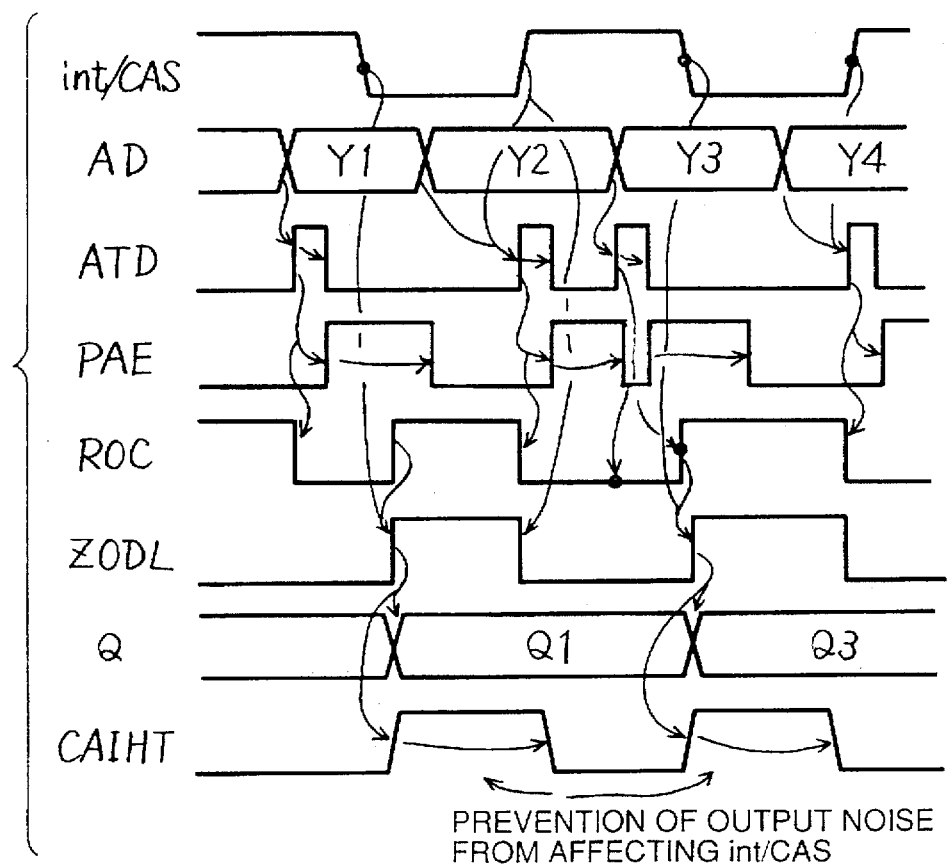
FIG. 2B is a signal waveform chart illustrating the operation of the read control circuit in FIG. 2A.

FIG. 2B is a signal waveform chart illustrating the operation of read control circuit 14 shown in FIG. 2A. The operation of the read control circuit shown in FIG. 2A will now be described with reference to FIG. 2B.

When the internal column address strobe signal int/CAS is at an H level with the row address strobe signal /RAS being in an active state at an L level, an address signal AD is set to a column address Y1. An address transition detection signal ATD is output from ATD circuit 12 in the form of a one-shot pulse in response to the change of the address signal to the address Y1. In response to the rise of the column address transition detection signal ATD, a read operation completion instruction signal ROC from read completion detection circuit 14b is driven to an L level to be set in a state indicating that the read operation has not been completed. Then, preamplifier enable circuit 14a brings a preamplifier enable signal PAE to an active state after a prescribed time period in response to the rise of the column address transition detection signal ATD. A period during which the preamplifier enable signal PAE is in an active state is predetermined. The deactivation timing of the preamplifier enable signal PAE may be determined by deactivation of the internal column address strobe signal int/CAS. Therefore, memory cell data read in accordance with the column address Y1 is amplified and retained by preamplifier 6.

Then, when the preamplifier enable signal PAE is brought into an active state and an output signal of preamplifier 6 is brought into a definite state after a prescribed time period from the activation of the preamplifier enable signal PAE, the read operation completion instruction signal ROC from read completion detection circuit 14b is brought into an active state at an H level. Thus, it is indicated that the read operation is completed and the definite data is output from the preamplifier and retained. Thereafter, when the read operation completion instruction signal ROC is brought into an active state at an H level, data transfer control circuit 14c drives data transfer instruction signal ZODL to an H level so long as the internal column address strobe signal int/CAS is at an L level. When the data transfer instruction signal ZODL is driven to an H level, data transfer circuit 7 shown in FIG. 1A introduces and latches read data RD from preamplifier 6 to output the latched data RDS to output buffer 8.

The output permission signal OEM has been already brought into an active state in response to activation of the internal column address strobe signal int/CAS (assuming that an output enable signal /OE is in an active state at an L level), and the data RDF output from data transfer circuit 7 is output through output buffer 8. Therefore, data Q1 corresponding to the column address Y1 is output as data Q. When data Q1 is output, inhibition circuit 14d causes CAS active inhibition signal CAIHT to be in an active state at an H level for a prescribed time period in accordance with the data transfer control signal ZODL. While the inhibition signal CAIHT is being in an active state, the internal column address strobe signal int/CAS is inhibited from being brought into an active state from an inactive state in CAS buffer 10a. It is at the time when data is output (when charge/discharge current flows in the output buffer) that output noise is generated. Therefore, the internal column address strobe signal int/CAS is prevented from being brought into an inactive state from an inactive state during that period, whereby the next erroneous data is inhibited from being output even if output noise is generated.

While the internal column address strobe signal int/CAS is being at an L level, the column address buffer is in a latching state. Therefore, even if the address changes from the address Y1 into an address Y2 during that period, the internal column address will not change. When the internal column address strobe signal int/CAS rises to an H level, the internal column address signal changes into address Y2, and the address transition detection signal ATD from ATD circuit 12 rises to an H level. The data transfer instruction signal ZODL is brought into an inactive state at an L level in response to the rise of the internal column address strobe signal int/CAS. In this state, data transfer circuit 7 is in a latching state, and data Q1 is continuously output from output buffer 8.

When the column address transition detection signal ATD is brought into an active state, the preamplifier enable signal PAE from preamplifier enable circuit 14a is brought into an active state at an H level. At this time, the read operation completion instruction signal ROC from read completion detection circuit 14b is again driven to an L level. Even if the preamplifier enable signal PAE is brought into an active state and preamplifier 6 operates to output data, the internal column address strobe signal int/CAS is at an H level during that period and the data output is not instructed, and therefore, output from the output buffer is data Q1 still. When the address again changes from the address Y2 into an address Y3 with the internal column address strobe signal int/CAS being at an H level, the column address transition detection signal ATD is again brought into an active state in accordance with the transition of the address. After the passage of a prescribed time period, the preamplifier enable signal PAE is again brought into an active state, and data in a memory cell corresponding to the address Y3 is amplified. Accordingly, data in the memory cell corresponding to the address Y3 is output from preamplifier 6 instead of data in a memory cell corresponding to the address Y2.

In this case, if the read operation completion instruction signal ROC is set at an L level by the address transition detection signal ATD corresponding to the address Y2, the preamplifier enable signal PAE corresponding to the address Y2 is output (activated), and the address transition detection signal ATD is again brought into an active state at an H level with data being in a definite state. After the passage of a prescribed time period from the time when the address transition detection signal ATD corresponding to the address Y3 is activated and then the preamplifier enable signal PAE is again brought into an active state, the read operation completion instruction signal ROC is brought into an active state at an H level. When the read operation completion instruction signal ROC is brought into an active state at an H level and the internal column address strobe signal int/CAS falls to an L level, the data read operation is designated, so that the data transfer instruction signal ZODL is brought into an active state at an H level and data from output buffer 8 changes from data Q1 into data Q3.

The output permission signal OEM is in an active state at an H level, and the CAS active inhibition signal CAIHT is again brought into an active state at an H level for a prescribed time period in response to activation of the data transfer instruction signal ZODL to an H level, so that the internal column address strobe signal int/CAS from CAS buffer 10a is inhibited from falling from an H level to an L level. Thus, it is inhibited that the internal column address strobe signal int/CAS is brought into an active state from an inactive state by the influence of output noise generated at the time of data output and the data is output in accordance with a wrong column address.

Figure 3A:
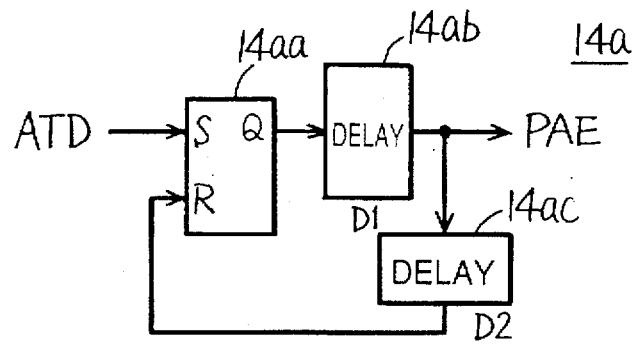
FIG. 3A is a diagram showing a structure of a preamplifier enable circuit shown in FIG. 2A.

FIG. 3A is a diagram showing one example of a structure of preamplifier enable circuit 14a shown in FIG. 2A. In FIG. 3A, preamplifier enable circuit 14a includes a set/reset flipflop 14aa being set in response to the rise of the column address transition detection signal ATD, a delay circuit 14ab for delaying an output signal from an output node Q of set/reset flipflop 14aa for a prescribed time period D1, and a delay circuit 14ac for delaying an output signal of delay circuit 14ab for a prescribed time period D2 to apply the delayed signal to a reset input R of set/reset flipflop 14aa.

Figure 3B:
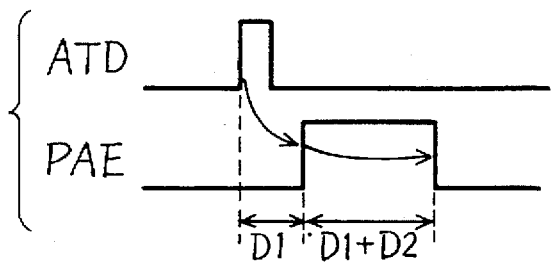
FIG. 3B is a signal waveform chart illustrating the operation of the preamplifier enable circuit shown in FIG. 3A.

In the case of the structure of preamplifier enable circuit 14a shown in FIG. 3A, as shown in the operation waveform of FIG. 3B, if the column address transition detection signal ATD attains an H level, the preamplifier enable signal PAE is brought into an active state at an H level after the passage of a prescribed time period D1 therefrom, causing the preamplifier to carry out the amplification operation. During this period D1, the column selection operation is performed by the column decoder and data in a selected memory cell is transmitted to the preamplifier. An output signal of delay circuit 14ac attains an H level after the passage of a time period D2 from the time when the preamplifier enable signal PAE has attained an H level, and set/reset flipflop 14aa is reset. Thus, an output signal of set/reset flipflop 14aa falls to an L level, and the preamplifier enable signal PAE from delay circuit 14ab falls to an L level after the passage of the time period D1. Therefore, an active period (H level period) of the preamplifier enable signal PAE is given by the sum of respective delay times D1 and D2 of delay circuits 14ab and 14ac. Note that the preamplifier enable signal PAE may be reset by the internal column address strobe signal int/CAS.

Figure 4A:
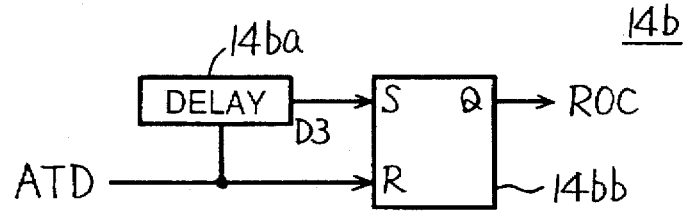
FIG. 4A is a diagram showing an example of a structure of a read completion detection circuit shown in FIG. 2A.

FIG. 4A is a diagram showing one example of a structure of the read completion detection circuit shown in FIG. 2A. In FIG. 4A, read completion detection circuit 14b includes a delay circuit 14ba for delaying the column address transition detection signal ATD for a prescribed time period D3, and a set/reset flipflop 14bb being set in response to the rise of an output signal of delay circuit 14ba and being reset in response to the rise of the column address transition detection signal ATD. A read operation completion instruction signal ROC is output from an output Q of flipflop 14bb. Delay time D3 of delay circuit 14ba is set so as to satisfy the following relationship with respective delay times D1 and D2 of delay circuits 14ab and 14ac included in preamplifier enable circuit 14a shown in FIG. 3A.

$$D1 < D3 \leq 2 \cdot D1 + D2$$

Figure 4B:
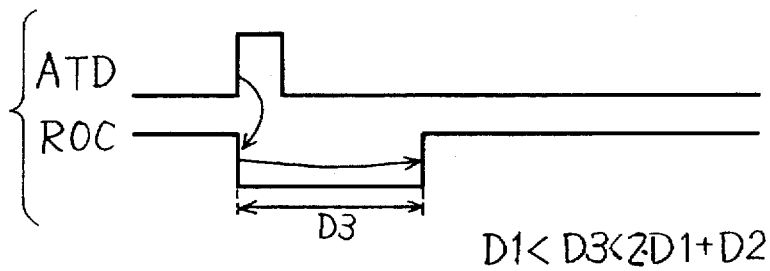
FIG. 4B is a signal waveform chart illustrating the operation of the read completion detection circuit shown in FIG. 4A.

The operation of read completion detection circuit 14b shown in FIG. 4A will now be described with reference to the operation waveform chart of FIG. 4B.

When the column address transition detection signal ATD attains an H level, set/reset flipflop 14bb is reset and the read operation completion instruction signal ROC output from output Q thereof is brought into an inactive state at an L level. Then, when a preamplifier enable signal PAE is brought into an active state at an H level to cause the preamplifier to operate. When output data from the preamplifier is brought into a definite state, an output signal from delay circuit 14ba attains an H level and set/reset flipflop 14bb is set, so that the read operation completion instruction signal ROC is brought into an active state at an H level. This read operation completion instruction signal only needs to be brought into an active state when the preamplifier enable signal PAE is activated and an output signal of the preamplifier is brought into a definite state.

Note that, in the structure of read completion detection circuit 14b shown in FIG. 4A, the read operation completion instruction signal ROC is brought into an active state at an H level by delaying the rise of the column address transition detection signal ATD. Alternatively, the read operation completion instruction signal ROC may be brought into an active state at an H level by delaying the fall of the column address transition detection signal ATD for a prescribed time period. This structure can be easily implemented by application of an inverted signal of the column address transition detection signal ATD to delay circuit 14ba.

FIG. 5A is a diagram showing one example of a structure of data transfer control circuit 14c shown in FIG. 2A. In FIG. 5A, data transfer control circuit 14c includes a gate circuit 14ca receiving the internal column address strobe signal int/CAS and read operation completion instruction signal ROC. Gate circuit 14ca activates the data transfer instruction signal ZODL at an H level when the internal column address strobe signal int/CAS is at an L level and the read operation completion instruction signal ROC is at an H level. The operation of data transfer control circuit 14c shown in FIG. 5A will now be described with reference to the operation waveform chart of FIG. 5B.

When the internal column address strobe signal int/CAS is at an H level, a column address changes and the read operation completion instruction signal ROC falls to an L level. Then, when the internal column address strobe signal int/CAS falls to an L level and the read operation completion instruction signal ROC rises to an H level, the data transfer instruction signal ZODL from gate circuit 14ca rises to an H level, and data is transferred from the preamplifier to the output buffer.

When the internal column address strobe signal int/CAS rises to an H level, the data transfer instruction signal ZODL from gate circuit 14ca falls to an L level. There are two kinds of relationships between the timing of the fall of the internal column address strobe signal int/CAS and the timing of the rise of the read operation completion instruction signal ROC. First, the internal column address strobe signal int/CAS is activated when the read operation completion instruction signal ROC is at an L level (shown by a dotted line in the figure). Second, the internal column address strobe signal int/CAS is activated to an L level after the read operation completion instruction signal ROC attains an H level. In both cases, the data transfer is carried out when data output from the preamplifier is brought into a definite state and data read operation is designated by the internal column address strobe signal int/CAS (the data transfer instruction signal ZODL attains an H level).

Figure 6A:
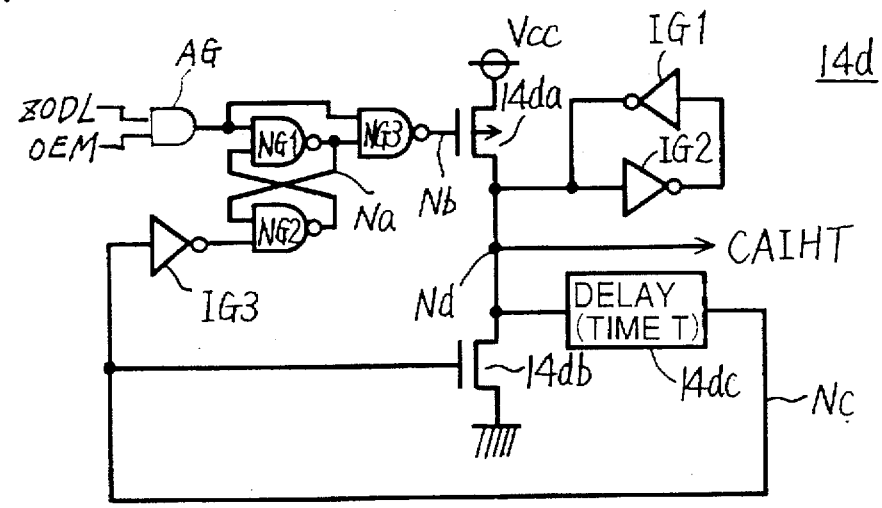
FIG. 6A is a diagram showing a structure of an inhibition circuit shown in FIG. 2A, and FIGS. 6B and 6C are signal waveform charts illustrating the operation of the inhibition circuit shown in FIG. 6A.

FIG. 6A is a diagram showing a specific structure of inhibition circuit 14d shown in FIG. 2A. In FIG. 6A, inhibition circuit 14d includes an AND circuit AG receiving a data transfer instruction signal ZODL and an output permission signal OEM, NAND circuits NG1 and NG2 constituting a flipflop, a NAND circuit NG3 receiving an output signal of NAND circuit NG1 and an output signal of AND circuit AG, a p channel MOS transistor 14da connected between a power supply node Vcc and an output node Nd and receiving an output signal of NAND circuit NG3 at its gate, inverter circuits IG1 and IG2 constituting an inverter latch for latching a signal CAIHT on output node Nd, a delay circuit 14dc for delaying the inhibition signal CAIHT from output node Nd for prescribed time T, an n channel MOS transistor 14db connected between output node Nd and a ground node and receiving an output signal of delay circuit 14dc at its gate, and an inverter circuit IG3 for inverting the output signal of delay circuit 14dc to apply the inverted signal to one input of NAND circuit NG2.

NAND circuit NG1 has its one input receiving the output signal of AND circuit AG, and the other input connected to an output of NAND circuit NG2. NAND circuit NG2 has the other input connected to an output node Na of NAND circuit NG1. The current driving capability of MOS transistor 14db is made sufficiently larger than the current driving capability of MOS transistor 14da and the latching capability of the inverter latch constituted by inverter circuits IG1 and IG2. In other words, the current driving capability of inverter circuit IG1 is made smaller than that of MOS transistor 14db. The operation of the inhibition circuit 14d shown in FIG. 6A will now be described with reference to the operation waveform chart of FIGS. 6B and 6C.

First, the operation at the time when a logical product signal of data transfer instruction signal ZODL and output permission signal OEM is activated for shorter time than the delay time T of delay circuit 14dc will now be described with reference to FIG. 6B. As will be described later in detail, the output permission signal OEM is activated when both output enable signal /OE and column address strobe signal /CAS are activated, and is deactivated when at least one of the signals /RAS and /OE is deactivated.

When an output signal (ZODL . OEM) of AND circuit AG is at an L level, potentials at output node Na of NAND circuit NG1 and at output node Nb of NAND circuit NG3 are at an H level. In this state, MOS transistor 14da is in a non-conductive state. In addition, an inhibition signal CAIHT is in an inactive state at an L level and a potential at an output node Nc of delay circuit 14dc is also at an L level.

When the output signal of AND circuit AG attains an H level, potentials at both inputs of NAND circuit NG3 attain an H level and a potential at output node Nb falls to an L level, whereby MOS transistor 14da is rendered conductive and the inhibition signal CAIHT from output node Nd rises to an H level. This inhibition signal CAIHT is latched by inverter circuits IG1 and IG2. If one of the data transfer instruction signal ZODL and the output permission signal OEM falls to an L level prior to the passage of delay time T of delay circuit 14dc, a potential at output node Nb of NAND circuit NG3 accordingly rises to an H level, and MOS transistor 14da is rendered non-conductive. In this state as well, the inhibition signal CAIHT is retained at an H level by inverter circuits IG1 and IG2.

After the passage of time T, an output signal of delay circuit 14dc attains an H level and MOS transistor 14db is rendered conductive, discharging output node Nd to a ground potential level. Since the current driving capability of MOS transistor 14db is sufficiently larger than that of inverter circuit IG1, the inhibition signal CAIHT falls to an L level. When the output signal of delay circuit 14dc attains an H level, an output signal of inverter circuit IG3 falls to an L level and an output signal of NAND circuit NG2 attains an H level. In this state, an output signal of NAND circuit NG1 has already returned to an H level by the output signal from AND circuit AG. When the inhibition signal CAIHT falls to an L level, the output signal of delay circuit 14dc falls to an L level after the passage of time T, and MOS transistor 14db is rendered non-conductive.

The operation in the case where delay time T of delay circuit 14dc is shorter than an H level period of a logical product signal of the data transfer instruction signal ZODL and the output permission signal OEM will now be described with reference to FIG. 6C.

In an initial state, the logical product signal of the data transfer instruction signal ZODL and the output permission signal OEM, that is, an output signal of AND circuit AG is at an L level, potentials at nodes Na and Nb are at an H level, a potential at node Nc is at an L level, and the inhibition signal CAIHT is at an L level. When the output signal of AND circuit AG attains an H level, a potential at an output node Nb of NAND circuit NG3 falls to an L level and MOS transistor 14da is rendered conductive, so that the inhibition signal CAIHT from output node Nd rises to an H level. After the passage of delay time T of delay circuit 14dc from the rise of the inhibition signal CAIHT to an H level, a potential at node Nc rises to an H level and MOS transistor 14db is rendered conductive, so that the inhibition signal CAIHT from output node Nd falls to an L level.

In this state, the output signal of AND circuit AG is still at an H level. Accordingly, when a potential at node Nc attains an H level, NAND circuit NG2 receives a signal at an L level through inverter circuit IG3, causing an output signal thereof to rise to an H level, and a signal transmitted from NAND circuit NG1 to node Na accordingly falls to an L level. Thus, a signal output from NAND circuit NG3 to node Nb attains an H level, and MOS transistor 14da is rendered non-conductive. Consequently, the inhibition signal CAIHT from output node Nd is quickly driven to an L level.

MOS transistor 14da is used merely to charge output node Nd to a power supply potential level, and does not require large current driving capability (the inhibition signal CAIHT is retained at an H level by the latch circuit constituted by inverter circuits IG1 and IG2). Therefore, even if there is a period during which both MOS transistors 14da and 14db are rendered conductive simultaneously, current consumption of MOS transistor 14da can be reduced sufficiently, and through current can be almost ignored.

A delay circuit having delay time for three stages of gates which corresponds to delay of a flipflop may be provided at the gate of MOS transistor 14db so that MOS transistor 14db may be surely rendered conductive after MOS transistor 14da is rendered non-conductive.

When the inhibition signal CAIHT from node Nd falls to an L level, a potential at node Nc falls to an L level after the passage of time T, and MOS transistor 14db is rendered non-conductive. The inhibition signal CAIHT at output node Nd is retained at an L level by inverter circuits IG1 and IG2. Thus, output node Nd is prevented from being brought into an electrically floating state even if both MOS transistors 14da and 14db are rendered non-conductive, and it can be ensured that the inhibition signal CAIHT is retained at an L level without being affected by noise.

Figure 6B:
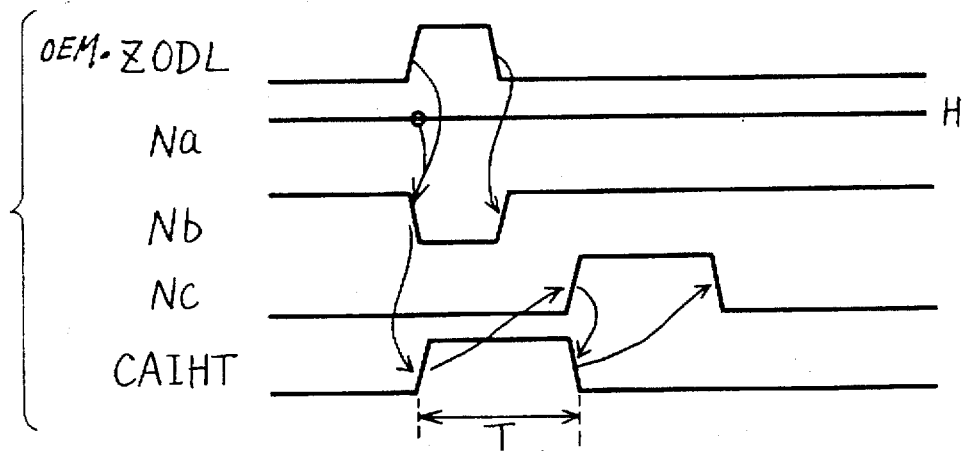
Figure 6C:
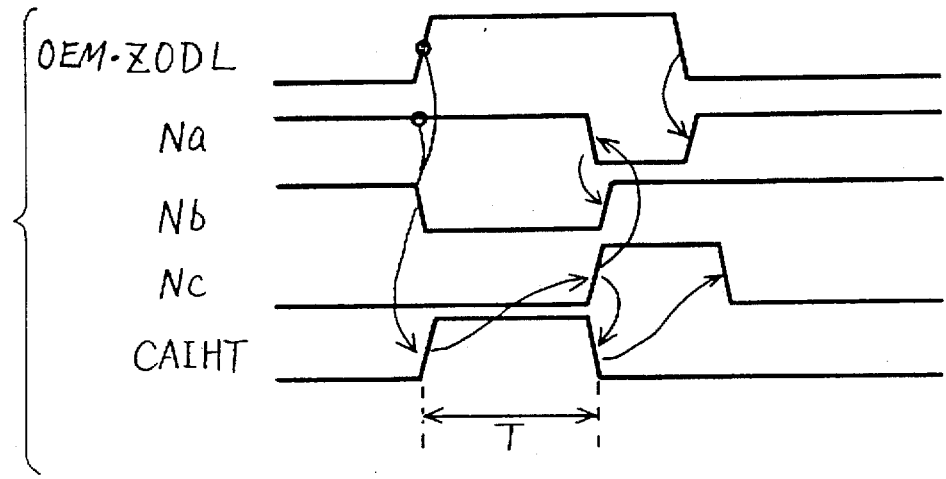

As shown in FIGS. 6B and 6C, the inhibition signal CAIHT having a fixed time period T can be always output regardless of whether a period during which both the data transfer instruction signal ZODL and the output permission signal OEM are at an H level is longer or shorter than delay time T. Thus, the internal column address strobe signal int/CAS can be prevented from being brought into an active state from an inactive state for the fixed time period T during data output regardless of the internal operation state, so that output of erroneous data resulting from output noise can be prevented.

Figure 7A:
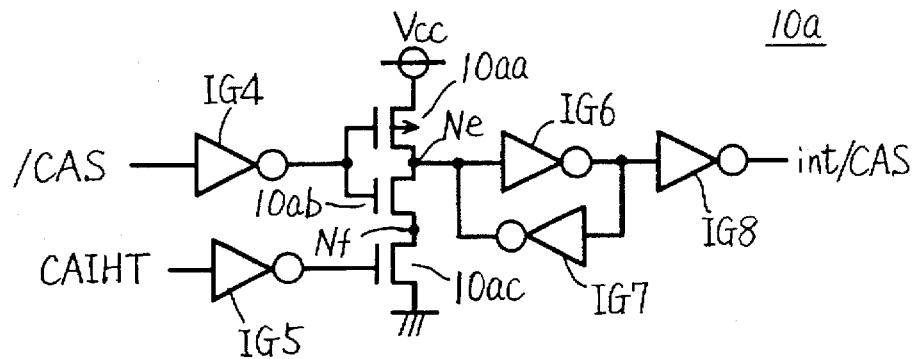
FIG. 7A is a diagram showing a structure of a CAS buffer shown in FIG. 2A, and FIGS. 7B and 7C are signal waveform charts illustrating the operation of the CAS buffer shown in FIG. 7A.

FIG. 7A is a diagram showing an example of a structure of CAS buffer 10a shown in FIG. 2A. In FIG. 7A, CAS buffer 10a includes an inverter circuit IG4 receiving an external column address strobe signal /CAS, an inverter circuit IG5 receiving CAS activation inhibition signal CAIHT, a p channel MOS transistor 10aa connected between a power supply node Vcc and an output node Ne receiving an output signal of inverter circuit IG4 and at its gate, an n channel MOS transistor 10ab connected between output node Ne and a node Nf and receiving the output signal of inverter circuit IG4 at its gate, an n channel MOS transistor 10ac connected between node Nf and a ground node and receiving an output signal of inverter circuit IG5 at its gate, inverter circuits IG6 and IG7 constituting an inverter latch for latching a signal on output node Ne, and an inverter circuit IG8 for inverting an output signal of inverter circuit IG6 to produce the internal column address strobe signal int/CAS. The operation of CAS buffer 10a shown in FIG. 7A will now be described with reference to the operation waveform charts of FIGS. 7B and 7C.

First, the operation at the time when CAS activation inhibition signal CAIHT is at an L level will now be described with reference to FIG. 7B. In this state, an output signal of inverter circuit IG5 is at an H level, n channel MOS transistor 10ac is in a conductive state, and node Nf is electrically connected to ground node Vss. Accordingly, MOS transistors 10aa and 10ab function as an inverter for inverting a logic level of a signal output from inverter circuit IG4 to output the inverted signal to output node Ne. More specifically, when external column address strobe signal /CAS is at an H level, the output signal of inverter circuit IG4 falls to an L level to render MOS transistor 10ab non-conductive and MOS transistor 10aa conductive, and a potential level at output node Ne attains an H level, so that the internal column address strobe int/CAS attains an H level.

On the other hand, when the external column address strobe signal /CAS is in an active state at an L level, the output signal of inverter circuit IG4 attains an H level, rendering MOS transistor 10aa non-conductive and MOS transistor 10ab conductive. Thus, output node Ne is discharged to a ground potential level through MOS transistors 10*ab* and 10*ac*, and the internal column address strobe signal int/CAS accordingly falls to an L level. In other words, when the CAS activation inhibition signal CAIHT is at an L level, MOS transistor 10*ac* is rendered conductive, and the internal column address strobe signal int/CAS according to the external column address strobe signal /CAS is output.

The operation at the time when the CAS activation inhibition signal CAIHT is at an H level will now be described with reference to FIG. 7C.

In this state, a signal output from inverter circuit IG5 is at an L level and MOS transistor 10*ac* is in a non-conductive state. Therefore, a path for discharging output node Ne to the ground potential level is cut off. When the external column address strobe signal /CAS rises to an H level, an output signal of inverter circuit IG4 falls to an L level, output node Ne is charged to a power supply voltage Vcc level through MOS transistor 10*aa*, and internal column address strobe signal int/CAS attains an H level. The H level of the internal column address strobe signal int/CAS is latched by inverter circuits IG6 and IG7. When the external column address strobe signal /CAS falls from an H level to an L level, the output signal of inverter circuit IG4 attains an H level, whereby MOS transistor 10*aa* is rendered non-conductive and MOS transistor 10*ab* conductive. However, MOS transistor 10*ac* is non-conductive, and therefore, discharging of output node Ne to the ground potential level is inhibited, and a potential level at output node Ne is retained by the latch circuit constituted by inverter circuits IG6 and IG7. The internal column address strobe signal int/CAS is accordingly kept at an H level.

More specifically, while the CAS active inhibition signal CAIHT is being at an H level, a path for discharging the internal column address strobe signal int/CAS to an active state at an L level is cut off, and the internal column address strobe signal int/CAS is retained in an inactive state. Therefore, the CAS activation inhibition signal CAIHT is brought into an active state at an H level at the timing when output data is output from the output buffer, whereby the path for discharging the internal column address strobe signal int/CAS is cut off, and therefore, the internal column address strobe signal int/CAS is prevented from being activated at an L level even with output noise being generated, so that output of erroneous data due to the influence of output noise in response to activation of the data transfer instruction signal can be suppressed. Furthermore, even if output noise is generated, node Ne is at power supply voltage Vcc level which is sufficiently higher than an input logic threshold of inverter circuit IG6, and a potential of a latched signal will not change.

Figure 8:
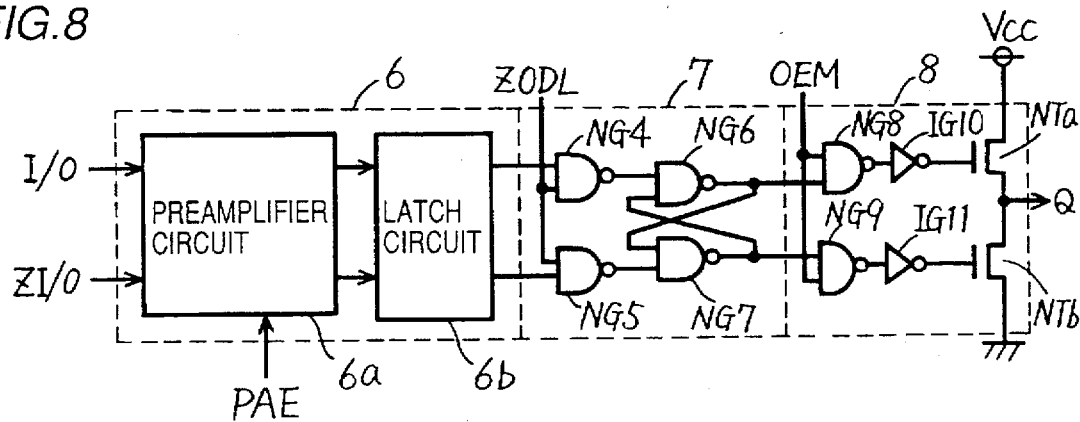
FIG. 8 is a diagram showing an example of a structure of a preamplifier, a data transfer circuit and an output buffer shown in FIG. 1.

FIG. 8 is a schematic diagram showing a structure of a data output portion. In FIG. 8, preamplifier 6 includes a preamplifier circuit 6*a* activated in response to activation of preamplifier enable signal PAE for amplifying memory cell data read onto internal data lines I/O and ZI/O, and a latch circuit 6*b* constituted by an inverter latch, for example, for latching data output from preamplifier circuit 6*a*.

Data transfer circuit 7 includes NAND circuits NG4 and NG5 enabled at the time when the data transfer instruction signal ZODL is at an H level for transferring data output from latch circuit 6*b*, and NAND circuits NG6 and NG7 constituting a flipflop for latching output signals of NAND circuits NG4 and NG5. Data complementary to each other are output from latch circuit 6*b* included in preamplifier 6, and each of NAND circuits NG4 and NG5 functions as an inverter when the data transfer instruction signal ZODL is at an H level, and inverts data transmitted from latch circuit 6*b* to transmit the inverted data.

NAND circuits NG6 and NG7 constitute a flipflop, and change an output state thereof when one of output signals of NAND circuits NG4 and NG5 falls to an L level, and latch the changed output state. When the output signals of NAND circuits NG4 and NG5 are at an H level, NAND circuits NG6 and NG7 are brought into an output latching state. Latch circuit 6*b* is provided for the purpose that data transfer from preamplifier 6 can be ensured and that data in a stand-by state resulting from reset of preamplifier 6 can be prevented from being latched in data transfer circuit 7 even if the data transfer instruction signal ZODL is at an H level at the time when the preamplifier enable signal PAE falls to an L level.

Output buffer 8 includes NAND circuits NG8 and NG9 responsive to activation (H level) of the output permission signal OEM for transferring data from data transfer circuit 7, inverter circuits IG10 and IG11 for respectively inverting output signals of NAND circuits NG8 and NG9, an n channel MOS transistor NTa rendered conductive in response to an H level of an output signal of inverter circuit IG10 for outputting data at a power supply voltage Vcc level, and an n channel MOS transistor NTb rendered conductive in response to an H level of an output signal of inverter circuit IG11 for discharging an output Q to a ground potential level. Accordingly, while the output permission signal OEM is being at an H level, this output buffer 8 buffers a signal (memory cell data) transmitted from data transfer circuit 7 to output the buffered data.

FIG. 9 is a schematic diagram showing a structure of a portion for outputting the output permission signal OEM in control signal generation circuit 10. In FIG. 9, control signal generation circuit 10 includes a gate circuit 10*b* externally receiving a row address strobe signal /RAS each externally applied, a write enable signal /WE for designating the data write operation, and an output enable signal /OE, an inverter circuit 10*c* receiving an external column address strobe signal /CAS, an AND circuit 10*d* receiving the column address strobe signal /CAS and an output signal of gate circuit 10*b*, a reset prioritized set/reset flipflop 10*e* being set in response to an H level of an output signal of inverter circuit 10*c* and reset in response to an H level of an output signal of AND circuit 10*d*, a gate circuit 10*f* receiving the row address strobe signal /RAS, the write enable signal /WE and the column address strobe signal /CAS, a gate circuit 10*g* receiving the output enable signal /OE and an output signal from an output Q of flipflop 10*e*, and a reset prioritized set/reset flipflop 10*h* being set in response to an H level of an output signal of gate circuit 10*f* and reset in response to an H level of an output signal of gate circuit 10*g*. The output permission signal OEM is output from an output Q of flipflop 10*h*.

Gate circuit 10*b* outputs a signal at an L level when the row address strobe signal /RAS and the output enable signal /OE fall to an L level and the write enable signal /WE rises to an H level. In other words, this gate circuit 10*b* has a function to prevent flipflop 10*e* from being reset when a memory cycle is started and data output is designated.

Gate circuit 10*f* outputs a signal at an H level when both the row address strobe signal /RAS and the column address strobe signal /CAS are at an L level and the write enable signal /WE is at an H level. Therefore, this gate circuit 10*f* sets flipflop 10*h* when the internal data read operation is designated.

Gate circuit 10*g* outputs a signal at an L level when the output enable signal /OE is at an L level and the output signal from output Q of flipflop 10*e* is at an H level. Therefore, this gate circuit 10*g* has a function to reset the output permission signal OEM to an inactive state at an L level when the output enable signal /OE is brought into an inactive state at an H level or when flipflop 10e is reset. The operation will now be described briefly.

In a stand-by state of the semiconductor memory device, the row address strobe signal /RAS and the column address strobe signal /CAS are at an H level. In this state, an output signal of gate circuit 10b is at an H level and an output signal of gate circuit 10d attains an H level, so that flipflop 10e is brought into a reset state and an output signal from output Q is retained at an L level. In addition, the signals /RAS and /CAS are at an H level, and therefore, gate circuit 10f outputs a signal at an L level. The output signal from output Q of flipflop 10e is at an L level, gate circuit 10g outputs a signal at an H level, and flipflop 10h is brought into a reset state, and therefore, the output permission signal OEM is retained inactive at an L level.

A memory cycle is started when the row address strobe signal /RAS falls to an L level. During data write operation, the write enable signal /WE is driven to an L level. Therefore, in this state, an output signal of gate circuit 10b attains an H level. When the column address strobe signal /CAS is driven to an L level, an output signal of gate circuit 10d falls to an L level and an output signal of inverter circuit 10c attains an H level, so that flipflop 10e is set and an output signal thereof attains an H level. However, an output signal of gate circuit 10f is at an L level during data write operation, and therefore, flipflop 10h is kept in a reset state and the output permission signal OEM is kept in an inactive state at an L level.

During data output operation, the write enable signal /WE is retained at an H level. When the output enable signal /OE and the column address strobe signal /CAS are driven to an L level, an output signal of gate circuit 10b falls to an L level and an output signal of gate circuit 10d also falls to an L level. On the other hand, an output signal of inverter circuit 10c attains an H level, so that flipflop 10e is set to have a signal from output Q thereof fall to an L level. Thus, an output signal of gate circuit 10g falls to an L level (the output enable signal /OE is at an L level) and an output signal of gate circuit 10f attains an H level, and therefore, flipflop 10h is set and the output permission signal OEM attains an H level. Even if the column address strobe signal /CAS is toggled between an H level and an L level while the output enable signal /OE is being at an L level, flipflops 10e and 10h are kept in a set state, and therefore, the output permission signal OEM is kept at an H level.

When the output enable signal /OE attains an H level, the output signal of gate circuit 10g attains an H level, so that flipflop 10h is reset and the output permission signal OEM falls to an L level. In this state, output of data from the output buffer is inhibited, and the output buffer is brought into an output high impedance state.

When the column address strobe signal /CAS and the output enable signal /OE are brought into an inactive state at an H level, the output signal of gate circuit 10d attains an H level, and therefore, flipflop 10e is reset and the output signal from output Q thereof falls to an L level. Thus, the output signal of gate circuit 10g attains an H level, so that flipflop 10h is reset and the output permission signal OEM is brought into an inactive state at an L level.

Therefore, this output permission signal OEM is brought into an active state when a memory cycle is started (the row address strobe signal /RAS is in an active state) and the data read operation is designated, and is kept in an active state at an H level until the memory cycle is completed and the row address strobe signal /RAS is brought into an inactive state at an H level or both the column address strobe signal /CAS and the output enable signal /OE are brought into an inactive state at an H level.

Activation of the internal column address strobe signal int/CAS is inhibited for a prescribed time period using the output permission signal OEM and the data transfer instruction signal ZODL, whereby transition of the internal column address strobe signal int/CAS to an active state can be inhibited only during data output operation. Therefore, during data write operation, the internal column address strobe signal int/CAS changes in accordance with the external column address strobe signal /CAS since the inhibition signal CAIHT is brought into an inactive state at an L level.

In the foregoing description, the column address strobe signal /CAS designates only the timing of data output. The internal column selection operation and the memory cell data read operation are carried out in accordance with the column address transition detection signal ATD. However, a structure in which the memory cell selection operation is started (the column decoder is enabled) when the column address strobe signal falls to an L level may be used.

[Conditions of pulse width of signal CAIHT]

FIG. 10 is a diagram illustrating a condition of RAS access time tRAC. In FIG. 10, access time tRAC from the time when external row address strobe signal /RAS falls to an L level until data Q is output is shown. In FIG. 10, column address strobe signal /CAS falls to an L level after the row address strobe signal /RAS falls to an L level, and then, again rises to an H level and thereafter falls to an L level.

For the column address strobe signal /CAS, time (/CAS holding time tCSH after "L" of /RAS) to drive the column address strobe signal /CAS to an L level from the passage of RAS-CAS delay time after the fall of the row address strobe signal /RAS and hold the L level is determined by the standard. In addition, transition time tT for the column address strobe signal /CAS to rise from an L level to an H level is determined by the standard (specification). The column address strobe signal /CAS needs to be retained at an H level for a time period determined by a /CAS "H" pulse width tCP. Thereafter, when the column address strobe signal /CAS is set to an L level, the following data will be output.

A CAS activation inhibition signal CAIHT needs to be brought into an inactive state before the column address strobe signal /CAS again falls to an L level after the rise thereof to an H level. On the tRAC condition, the CAS activation inhibition signal CAIHT must be driven to an L level within the time tCSH+tCP+2 . tT. Therefore, in this case, the CAS activation inhibition signal CAIHT must be brought into an inactive state within 48+10+2 . 2=62 ns after the fall of the row address strobe signal /RAS to an L level. In FIG. 10, specification time for each time is shown by a numeral in parentheses (unit: nS; cycle time: 62 nS).

FIG. 11 is a diagram showing the relationship between CAS access time tCAC and a pulse width of the inhibition signal CAIHT. In FIG. 11, output data Q is brought into a definite state after the passage of CAS access time tCAC from the fall of the column address strobe signal /CAS to an L level. On this condition, hyper page mode (EDO mode) read/write cycle time tHPC of the column address strobe signal /CAS is 25 nS. The CAS activation inhibition signal CAIHT needs to fall to an L level within a period from the fall of the column address strobe signal /CAS until the next fall thereof. Therefore, the CAS activation inhibition signal CAIHT is brought into an inactive state at an L level within the hyper page mode read/write cycle time tHPC after the fall of the column address strobe signal CAS to an L level.

Figure 12:
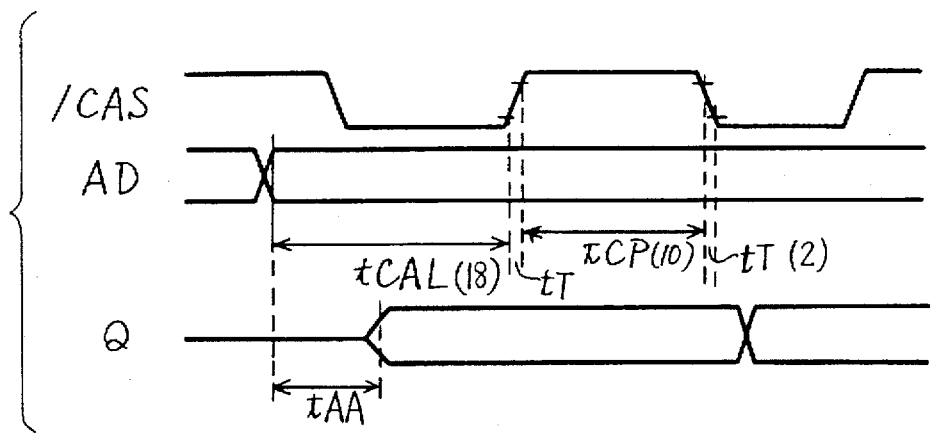
FIG. 12 is a diagram illustrating the relationship between an address access time and a pulse width of a CAS active inhibition signal.

FIG. 12 is a diagram showing an address access time tAA. In FIG. 12, address access time tAA is a time period required from the time when an address signal AD changes until valid data Q is output. Time called column address. CAS hold time tCAL is necessary to retain the column address strobe signal /CAS at an L level. In the EDO mode, the column address strobe signal /CAS is driven to an H level after the passage of the time tCAL, and is again driven to an L level after the passage of a CAS H pulse period tCP. Therefore, the CAS activation inhibition signal CAIHT is brought into an inactive state at an L level within a time period tCAL+tCP+2 . tT. The time periods tCAL, tCP and tT are 18 nS, 10 nS and 2 nS, respectively, and the CAS activation inhibition signal CAIHT is brought into an inactive state within 32 nS after the change of the column address AD.

Figure 13:
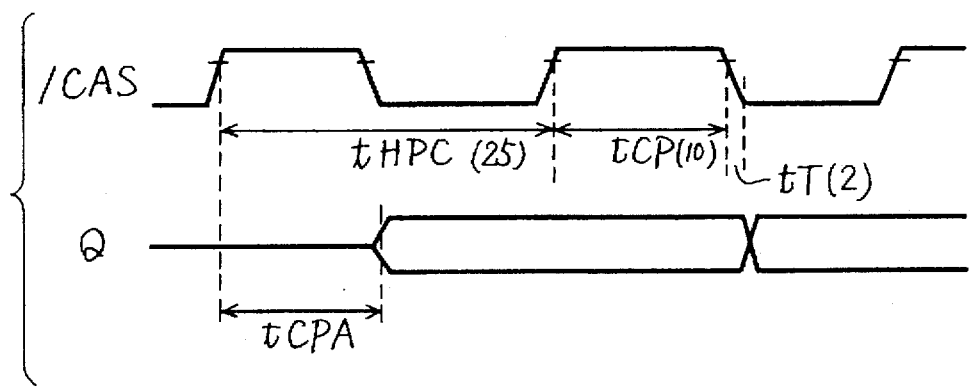
FIG. 13 is a diagram illustrating the relationship between CAS precharge access time and a pulse width of a CAS active inhibition signal.

FIG. 13 is a diagram showing CAS precharge access time tCPA. In FIG. 13, valid data can be output after the passage of the CAS precharge access time tCPA from the rise of the column address strobe signal /CAS to an H level. In this case, new data is output after the passage of the hyper page mode read/write cycle time tHPC, the CAS "H" pulse width tCP and the transition time tT. Therefore, the CAS activation inhibition signal CAIHT needs to be brought into an inactive state at an L level within a time period tHPC+tCP+tT. The time periods tHPC, tCP and tT are 25 nS, 10 nS and 2 nS, respectively, and the CAS activation inhibition signal CAIHT needs to be brought into an inactive state at an L level within 37 nS after the rise of the column address strobe signal /CAS.

Figure 14:
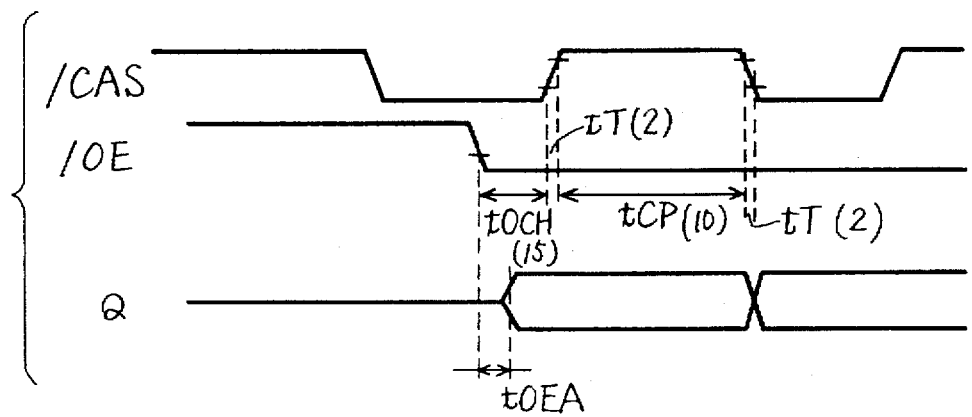
FIG. 14 is a diagram illustrating the relationship between output enable access time and a pulse width of a CAS active inhibition signal.
Figure 17A:
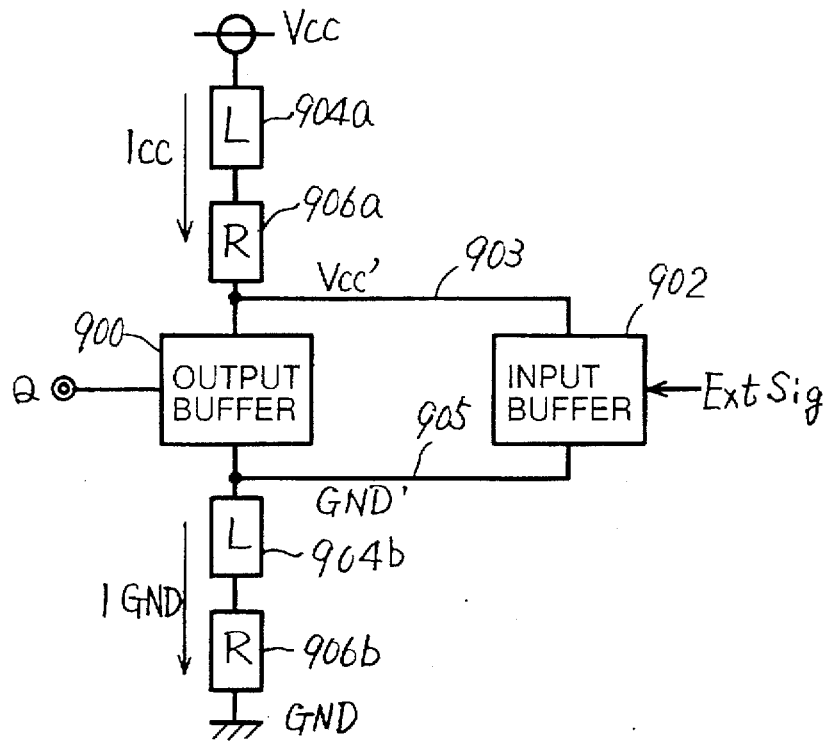
FIG. 17A is a schematic diagram showing a structure of a control buffer and an input buffer in a conventional semiconductor integrated circuit device.
Figure 17B:
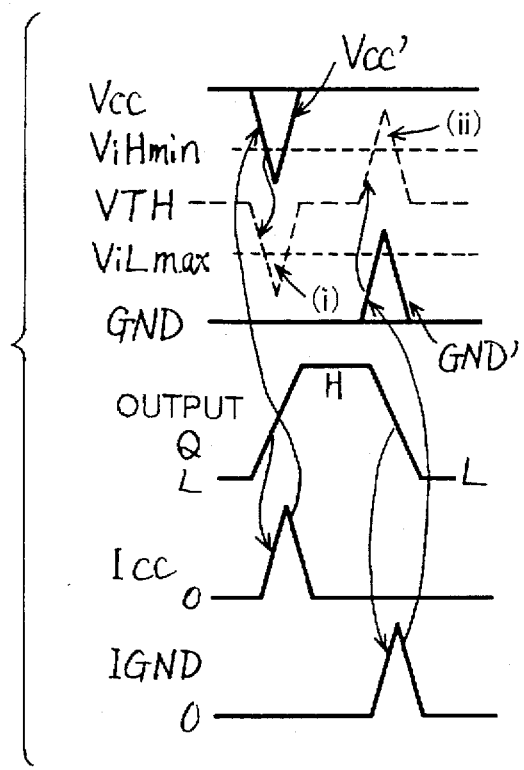
FIG. 17B is a diagram illustrating problems caused during data output of the semiconductor integrated circuit device shown in FIG. 17A.
Figure 18:
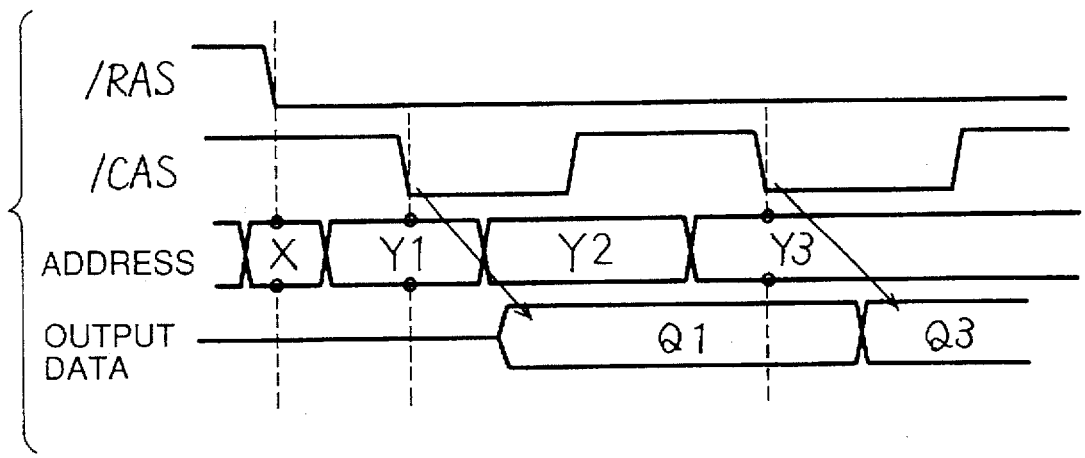
FIG. 18 is a signal waveform chart illustrating the data output operation of a conventional semiconductor memory device in an EDO mode.
Figure 19:
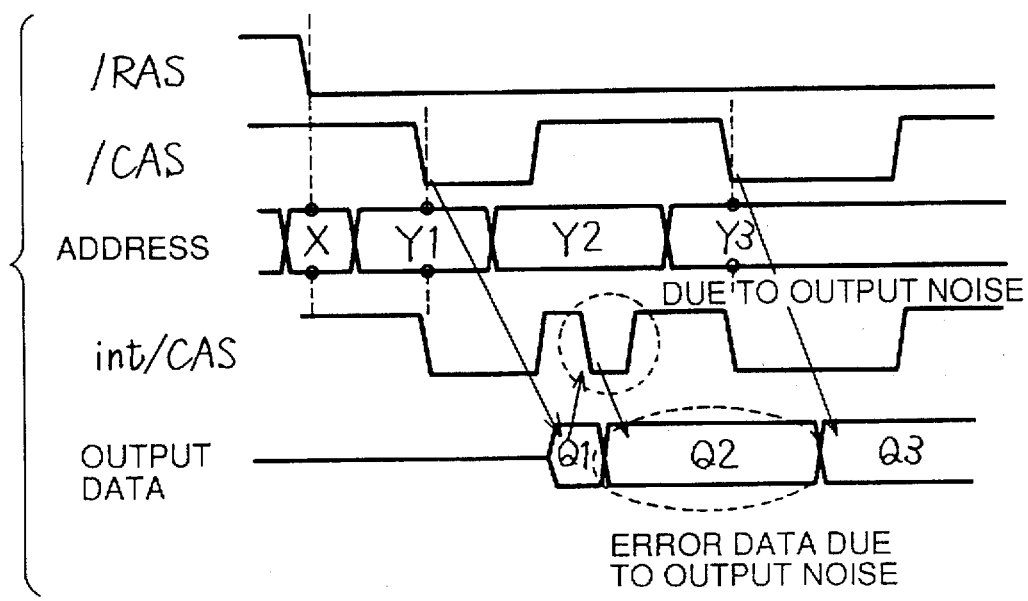
FIG. 19 is a diagram illustrating the influence of output noise on data output in the conventional semiconductor memory device.

FIG. 14 is a diagram showing OE access time tOEA. Valid data is output after the passage of the OE access time tOEA from the activation of the output enable signal /OE at an L level. In this case, even if the column address strobe signal /CAS is brought into an active state at an L level, data will not be output until the output enable signal /OE is brought into an active state at an L level. For the output enable signal /OE, the column address strobe signal /CAS needs to be retained at an L level during a period called /CAS holding time tOCH after "L" of /OE. The column address strobe signal /CAS must be once driven to an H level and then again to an L level before the next data is output. Therefore, for the output enable signal /OE, the CAS activation inhibition signal CAIHT must be brought into an inactive state at an L level within a time period tOCH+tT+tCP+tT. The time periods tOCH, tCT and tT are 15 nS, 10 nS and 2 nS, respectively, and the CAS activation inhibition signal CAIHT needs to be brought into an inactive state at an L level within 29 nS after the fall of the output enable signal /OE to an L level.

The CAS activation inhibition signal CAIHT needs to be in an active state at an H level for a prescribed period so as to satisfy the five conditions shown in FIGS. 10 to 14. The time period T of the CAS activation inhibition signal CAIHT satisfying the five conditions shown in FIGS. 10 to 14 can have a certain width between the maximum value and the minimum value. Therefore, when access time of a semiconductor memory device is short and valid data is output at a high speed, a time period between the permissible maximum value and the permissible minimum value of the CAS activation inhibition signal CAIHT can be made long.

As in the foregoing, according to the present invention, since the internal column address strobe signal (read operation start instruction signal) is inhibited from being brought into an active state for a prescribed period in adaptation to timing at which valid data is output, output of unnecessary erroneous data resulting from output noise can be prevented, achieving implementation of a semiconductor memory device with high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells arranged in rows and columns, comprising:

a control input buffer receiving an external read operation start instruction signal for at least buffering the received signal to generate an internal read operation start instruction signal;

read means for reading data in a memory cell out of said plurality of memory cells addressed in accordance with a column address signal;

read control means responsive to change in said column address signal for activating said read means and for generating a data read completion instruction signal and;

data output means responsive to said internal read operation start instruction signal and said data read completion instruction signal for externally outputting the data read by said read means, said read control means including inhibition means responsive to external data outputting by said data output means for inhibiting said internal read operation instruction signal from shifting into an active state from an inactive state.

2. The semiconductor memory device as recited in claim 1, wherein said data output means includes data transfer means being brought into a through state in which the data read from said data read means is passed therethrough and latched when activated, and being brought into a latching state in which output data thereof is latched regardless of applied data when deactivated, output buffer means for externally outputting the data transferred from said data transfer means when activated, means responsive to activation of said internal read operation start instruction signal and said data read completion instruction signal for activating said data transfer means, and means responsive to activation of said internal read operation start instruction signal for activating said output buffer means.

3. The semiconductor memory device as recited in claim 1, wherein said inhibition means includes means for generating an inhibition instruction signal to apply the generated signal to said control input buffer, and said control input buffer includes means responsive to activation of the inhibition instruction signal from said inhibition means for cutting off a path for driving said internal read operation start instruction signal to an active state.

4. The semiconductor memory device as recited in claim 3, wherein said inhibition means includes a flipflop being set in response to said data outputting by said data output means, a first transistor element being rendered conductive in response to an output of said flipflop being set for activating said inhibition instruction signal, delay means for delaying said inhibition instruction signal, and a second transistor element responsive to activation of an output signal of said delay means for deactivating said inhibition instruction signal, wherein said flipflop is reset in response to activation of the output signal of said delay means.

5. The semiconductor memory device as recited in claim 4, wherein said data output means includes transfer means for latching and transferring the data read by said read means in response to activation of a data transfer instruction signal, and means for externally outputting the data transferred from said transfer means in response to activation of a data output permission signal, and wherein said flipflop is set in response to activation of said data transfer instruction signal and said data output permission signal.

6. The semiconductor memory device as recited in claim 3, wherein said control input buffer includes a buffer for buffering said external read operation start instruction signal, a latch circuit for latching an output signal of said buffer to generate said internal read operation start instruction signal, and means responsive to said inhibition instruction signal for cutting off a path for driving said internal read operation start instruction signal of said buffer to an active state.

7. The semiconductor memory device as recited in claim 1, wherein said internal read operation start instruction signal includes a column address strobe signal for instructing incorporation of a column address signal.

8. The semiconductor memory device as recited in claim 5, wherein said flipflop includes a set/reset flipflop being set when both said data transfer instruction signal and said data output permission signal are activated and reset when the output signal of said delay circuit is activated, and a logic gate for rendering said first transistor element conductive when said data transfer instruction signal, said data output permission signal, and an output signal of said set/reset flipflop are all in an active state.

* * * * *